(12) United States Patent
Dong et al.

(10) Patent No.: US 11,885,844 B2
(45) Date of Patent: Jan. 30, 2024

(54) METHOD AND DEVICE FOR DETECTING INSULATION STATE IN CONVERSION SYSTEM

(71) Applicant: Delta Electronics (Shanghai) Co., Ltd., Shanghai (CN)

(72) Inventors: Jianxing Dong, Shanghai (CN); Teng Liu, Shanghai (CN); Xin Wang, Shanghai (CN); Jianping Ying, Shanghai (CN)

(73) Assignee: DELTA ELECTRONICS (SHANGHAI) CO., LTD., Shanghai (CN)

(*) Notice: Subject to any disclaimer, the term of this patent is extended or adjusted under 35 U.S.C. 154(b) by 0 days.

(21) Appl. No.: 17/816,730

(22) Filed: Aug. 2, 2022

(65) Prior Publication Data

US 2023/0041739 A1 Feb. 9, 2023

(30) Foreign Application Priority Data

Aug. 3, 2021 (CN) .......................... 202110884812.7

(51) Int. Cl.
*G01R 31/12* (2020.01)
*G01R 31/52* (2020.01)
*H02M 1/08* (2006.01)

(52) U.S. Cl.
CPC ......... *G01R 31/1227* (2013.01); *G01R 31/52* (2020.01); *H02M 1/08* (2013.01)

(58) Field of Classification Search
CPC .... G01R 31/1227; G01R 31/52; G01R 31/14; G01R 31/40; G01R 31/1272; H02M 1/08; H02M 1/0074; H02M 7/02; H02M 3/22
See application file for complete search history.

(56) References Cited

U.S. PATENT DOCUMENTS 4,338,561 A * 7/1982 Zaengl .................. G01R 31/14
323/208
5,172,289 A * 12/1992 Zelm ..................... G01R 31/52
361/23

(Continued)

FOREIGN PATENT DOCUMENTS

| CN | 202512202 U | 10/2012 |
| CN | 203811750 U | 9/2014 |
| CN | 103257306 B | 6/2015 |

*Primary Examiner* — Patrick Assouad
*Assistant Examiner* — Demetrius R Pretlow
(74) *Attorney, Agent, or Firm* — CKC & Partners Co., LLC

(57) ABSTRACT

The disclosure discloses a method and device for detecting insulation state in a conversion system, wherein the conversion system includes an excitation source, a converter having an input end coupled to the excitation source, a connection element coupled between an output end of the converter and a reference point, and a coupling impedance having a first end coupled to the excitation source and a second end coupled to the reference point, the method for detecting insulation state including steps of: S1, controlling at least one main power switch of the converter not to switch; S2, detecting a pulse current signal of the connection element; and S3, processing the pulse current signal and outputting a partial discharge information, the partial discharge information indicating an insulation state of an isolating transformer in the converter. The disclosure can overcome electromagnetic interference of high frequency steep waves on a partial discharge signal.

17 Claims, 6 Drawing Sheets

(56) References Cited

U.S. PATENT DOCUMENTS

| | | | | |
|---|---|---|---|---|
| 5,574,378 A * | 11/1996 | Meyer | ............... | G01R 31/52 |
| | | | | 361/57 |
| 5,652,521 A * | 7/1997 | Meyer | ............... | G01R 15/16 |
| | | | | 324/541 |
| 7,075,311 B1 * | 7/2006 | Oshiro | ............... | G01R 31/14 |
| | | | | 324/557 |
| 9,733,281 B2 | 8/2017 | Kshirsagar et al. | | |
| 10,598,733 B2 | 3/2020 | Giussani et al. | | |
| 11,243,243 B2 | 2/2022 | Han et al. | | |
| 2001/0048310 A1 * | 12/2001 | Takahashi | ............. | G01R 31/346 |
| | | | | 324/551 |
| 2014/0197844 A1 * | 7/2014 | Chang | ............... | G01R 31/52 |
| | | | | 324/509 |
| 2016/0245855 A1 * | 8/2016 | Serban | ............... | H02M 3/156 |
| 2018/0083527 A1 * | 3/2018 | Fukuda | ............... | G01R 31/08 |
| 2020/0057009 A1 * | 2/2020 | Pakr | ............... | G01R 31/1272 |
| 2020/0191763 A1 * | 6/2020 | Berler | ............... | G08B 21/182 |
| 2020/0241081 A1 * | 7/2020 | Zhang | ............... | G01R 31/62 |
| 2020/0271713 A1 * | 8/2020 | Zhang | ............... | G01R 31/52 |
| 2021/0132157 A1 * | 5/2021 | Chai | ............... | G01R 31/40 |
| 2022/0373587 A1 * | 11/2022 | Fischereder | ............ | G01R 15/04 |
| 2022/0373588 A1 * | 11/2022 | Maki | ............... | H02P 29/024 |

\* cited by examiner

METHOD AND DEVICE FOR DETECTING INSULATION STATE IN CONVERSION SYSTEM

CROSS-REFERENCE TO RELATED APPLICATIONS

This non-provisional application claims priority under 35 U.S.C. § 119(a) on Patent Application No. 202110884812.7 filed in P.R. China on Aug. 3, 2021, the entire contents of which are hereby incorporated by reference.

Some references, if any, which may include patents, patent applications and various publications, may be cited and discussed in the description of this disclosure. The citation and/or discussion of such references, if any, is provided merely to clarify the description of the present disclosure and is not an admission that any such reference is "prior art" to the disclosure described herein. All references listed, cited and/or discussed in this specification are incorporated herein by reference in their entireties and to the same extent as if each reference was individually incorporated by reference.

BACKGROUND

1. Field of the Invention

The present disclosure relates to the field of power electronic devices, and particularly to a method and device for detecting insulation state in a conversion system.

2. Related Art

As new materials and elements are widely applied, the power electronic devices tend to develop in directions of a high frequency and a high power density. Increasing an operating frequency of magnetic elements (e.g., a main power transformer) in the power electronic devices can reduce volume and weight of the magnetic elements.

As an important component for electric isolation between high and low voltages, the main power transformer with high frequency of an isolated converter for medium level and high level voltage bears an operating voltage for a long time and overvoltage stress under fault conditions in the system. As the volume of the transformer is decreased, a main insulation structure between primary and secondary sides of the transformer bears a higher electric field stress, and the higher the electric field stress is, the higher a risk of partial discharge will be.

Mostly, the reason of partial discharge phenomena is that intensity of a localized electric field nearby an insulation material is high, causing localized breakdown of the insulation material. Generally, discharge that naked eye can see is referred to as arc discharge, and invisible discharge is referred to as partial discharge. Partial discharge causes deterioration of the insulation material, molecular degradation and carbonization, and finally causes early failure of insulation.

A method known to the inventors for detecting partial discharge in a power system is a pulse current method, which is to apply a certain voltage to both ends of a tested product, so an instantaneous voltage change is produced at both ends, and then a pulse current is produced in a loop formed by the tested product, a coupling capacitor, and a detection impedance. The pulse current will produce a pulse voltage at both ends of the detection impedance when flowing through, and the pulse voltage is processed by sampling, amplifying, and displaying, thereby obtaining some base quantities of partial discharge, in particularly a quantity of partial discharge.

SUMMARY

The disclosure provides a method and device for detecting insulation state in a conversion system, which can detect an insulation state of the conversion system reliably and efficiently at a low cost.

The disclosure provides a method for detecting insulation state in a conversion system, wherein the conversion system includes an excitation source, a converter having an input end coupled to the excitation source, a connection element coupled between an output end of the converter and a reference point, and a coupling impedance having a first end coupled to the excitation source and a second end coupled to the reference point, the method for detecting insulation state including steps of:

S1, controlling at least one main power switch of the converter not to switch;

S2, detecting a pulse current signal of the connection element; and

S3, processing the pulse current signal and outputting a partial discharge information, the partial discharge information indicating an insulation state of an isolating transformer in the converter.

The disclosure further provides a device for detecting insulation state in a conversion system, wherein the conversion system includes an excitation source, a converter having an input end coupled to the excitation source, a connection element coupled between an output end of the converter and a reference point, and a coupling impedance having a first end coupled to the excitation source and a second end coupled to the reference point, the device for detecting insulation state including:

a pulse current sensor sleeved on the connection element for detecting a pulse current signal of the connection element when at least one main power switch of the converter does not switch; and a partial discharge signal processing unit connected to the pulse current sensor for receiving the pulse current signal, processing the pulse current signal, and outputting partial discharge information, wherein the partial discharge information indicating an insulation state of an isolating transformer in the converter.

In the disclosure, the excitation source, the converter, the connection element, and the coupling impedance in the conversion system form a detection loop, and it is unnecessary to additionally supply an excitation source by using the existing bus capacitor or AC source in the conversion system as the excitation source, such that detection of the insulation state of the isolating transformer in the converter becomes simpler, more reliable, and lower-cost. By controlling at least one main power switching device of the converter not to switch, electromagnetic interference of high frequency steep waves on a partial discharge signal is avoided.

Hereinafter the disclosure is described in detail with reference to the accompanying drawings and the detailed embodiments, but the disclosure is not limited thereto.

DETAILED EMBODIMENTS OF THE INVENTION

The technical solution of the disclosure is described in detail with reference to the accompanying drawings and the detailed embodiments to further understand objects, solutions, and effects of the disclosure, instead of limiting the scope protected by the appended claims of the disclosure.

Figure 1:
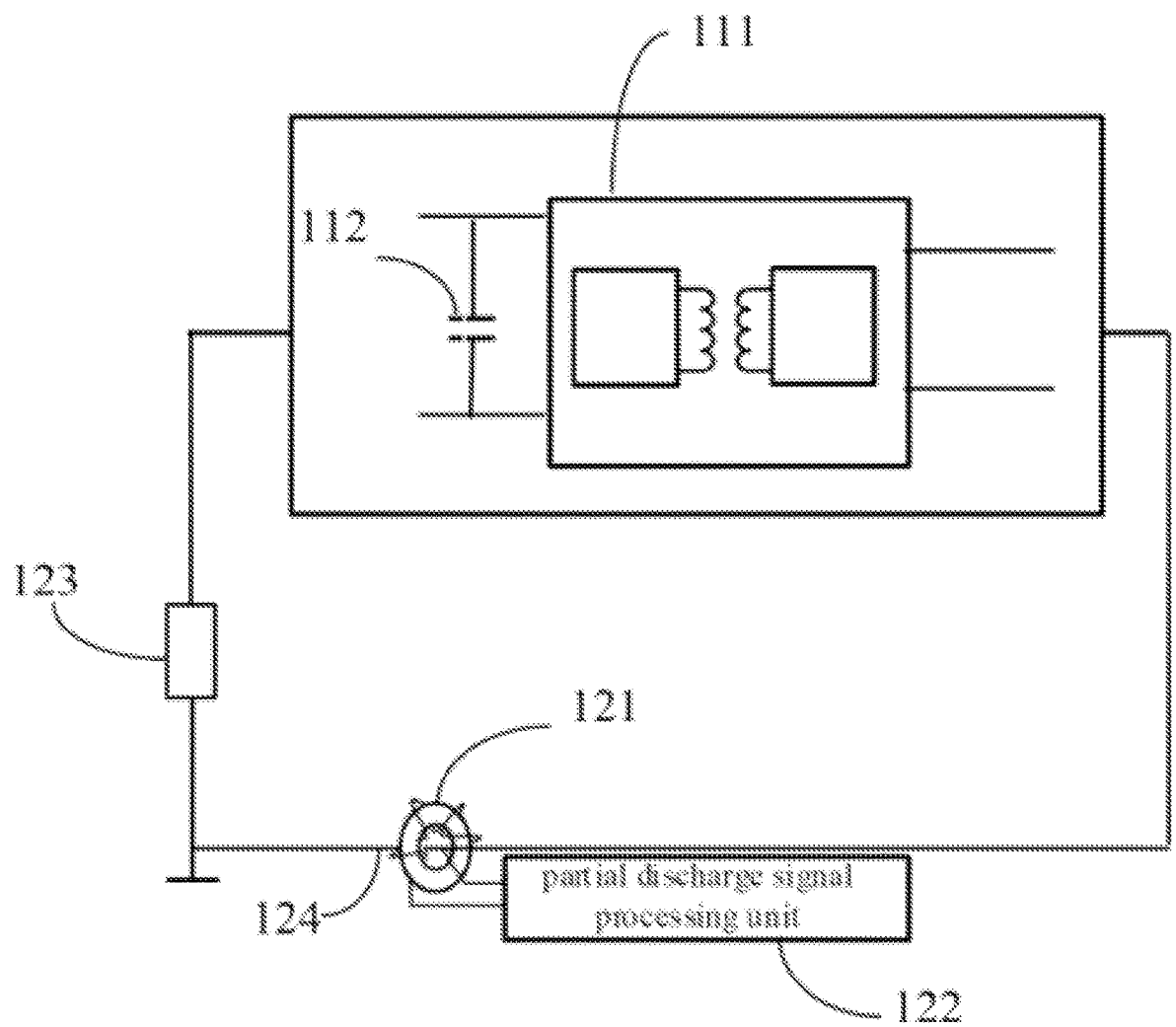
FIG. 1 is a schematic diagram of a device for detecting insulation state in a conversion system provided in one embodiment of the disclosure.

FIG. 1 is a schematic diagram of a device for detecting insulation state in a conversion system provided in at least one embodiment of the disclosure. Referring to FIG. 1, the embodiment of the disclosure provides a device for detecting insulation state in a power conversion system, wherein the power conversion system includes an excitation source 112, a converter 111 including an isolated converter with high frequency for medium and high voltage levels having an isolating transformer, an input end of the converter 111 coupled to the excitation source 112, a connection element 124 coupled between an output end of the converter 111 and a reference point, and a coupling impedance 123 having a first end coupled to the excitation source 112 and a second end coupled to the reference point. The reference point can be selected as any point in the circuit, for example, earth, but not limit to. The excitation source 112, the converter 111, the connection element 124 and the coupling impedance 123 form an insulation state detection loop in the power conversion system. The device for detecting insulation state includes a pulse current sensor 121 sleeved on the connection element 124 for detecting a pulse current signal of the connection element when at least one main power switch of the converter 111 does not switch, and a partial discharge signal processing unit 122 connected to the pulse current sensor 121 for receiving the pulse current signal, processing the pulse current signal, and outputting partial discharge information, which indicating an insulation state of the isolating transformer in the converter 111. The partial discharge information is fed back to Human Machine Interface (HMI) and users to facilitate users timely grasping the insulation state of the isolating transformer, and avoid accidents caused by partial discharge.

Figure 2:
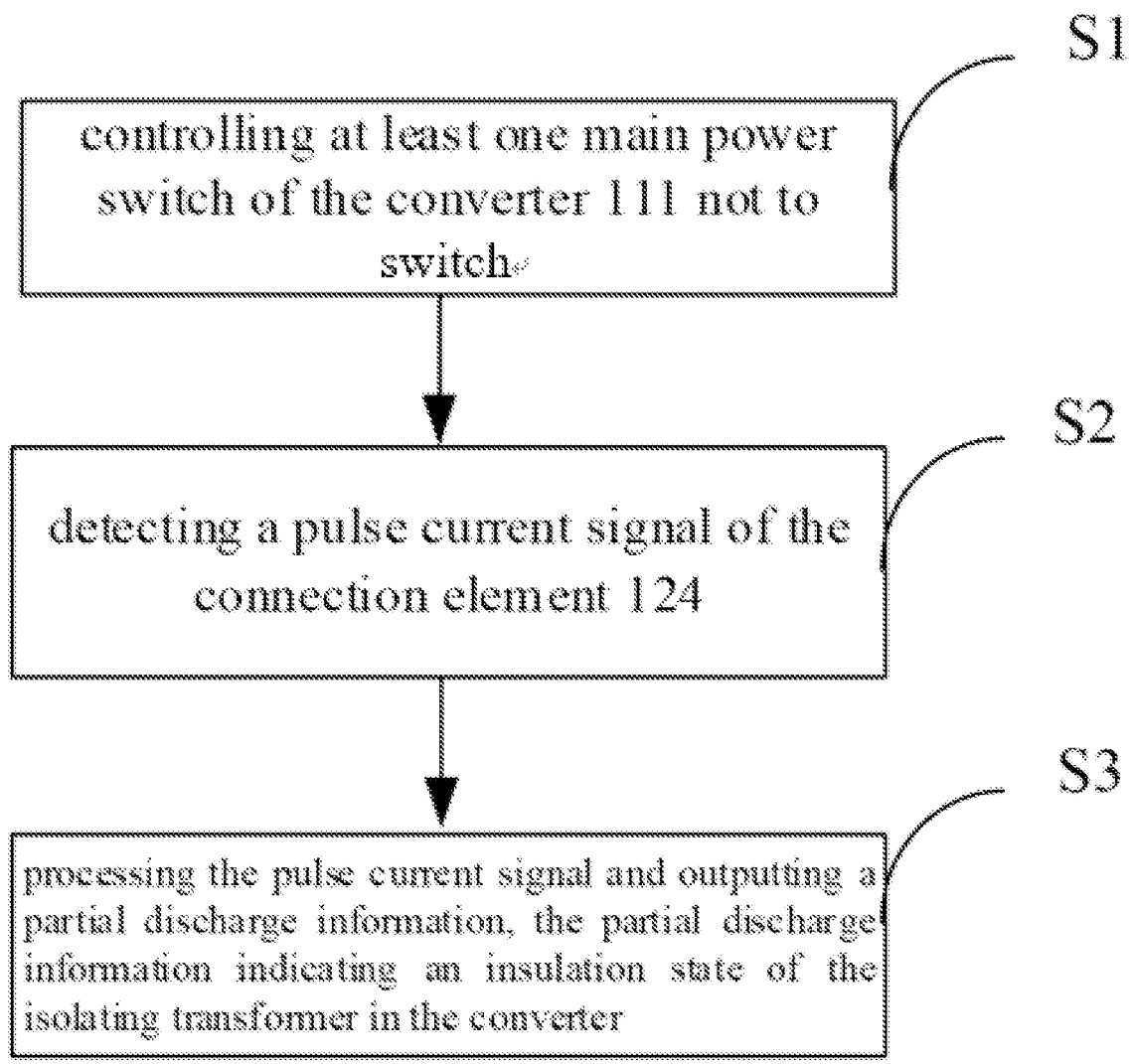
FIG. 2 is a flow diagram of steps of a method for detecting insulation state provided in one embodiment of the disclosure.

FIG. 2 is a flow diagram of a method for detecting insulation state provided in one embodiment of the disclosure. Referring to FIGS. 1 and 2, the embodiment of the disclosure provides a method for detecting insulation state in a conversion system, wherein the conversion system includes an excitation source 112, a converter 111 including an isolated converter with high frequency for medium and high voltage levels having an isolating transformer, and having an input end of the converter 111 coupled to the excitation source 112, a connection element 124 coupled between an output end of the converter 111 and a reference point, and a coupling impedance 123 having a first end coupled to the excitation source 112 and a second end coupled to the reference point. The reference point can be selected as any point in the circuit, for example, earth, but not limit to. The method for detecting insulation state includes steps of:

S1, controlling at least one main power switch of the converter 111 not to switch;

S2, detecting a pulse current signal of the connection element 124; and

S3, processing the pulse current signal and outputting a partial discharge information, the partial discharge information indicating an insulation state of the isolating transformer in the converter.

As can be seen, when detecting the partial discharge information of the isolating transformer in the converter 111, at least one main power switch in the converter 111 shall be controlled to be disconnected, and at least one main power switch is a switching device mainly functioning for power conversion in the converter 111, the type of the at least one main power switches can be such as, Insulated Gate Bipolar Transistor (IGBT), an Integrated Gate Commutated Thyristor (IGCT), a Metal-Oxide-Semiconductor Field-Effect Transistor (MOSFET), gallium nitride (GaN), such that it is possible to avoid the electromagnetic interference on a partial discharge signal caused by high frequency steep waves, thus get rid of the influence on detection of partial discharge of the isolating transformer in the converter 111.

In the embodiment of the disclosure, it is unnecessary to supply an excitation source for detection of the insulation state additionally. By using the existing power source in the conversion system as the excitation source 112, such that detection of partial discharge of the isolating transformer in the conversion system becomes simple, reliable, efficient, and low-cost.

Figure 3:
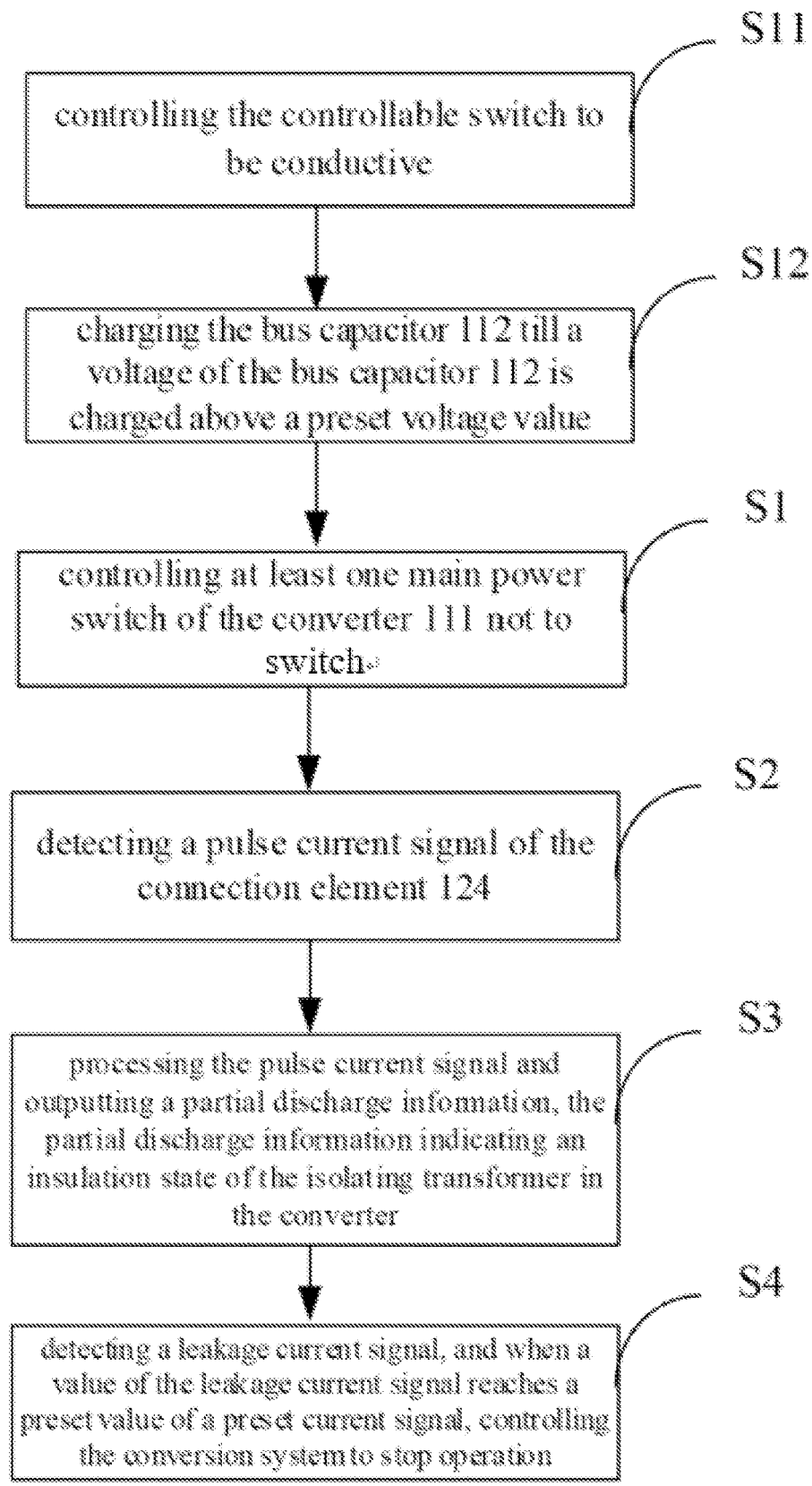
FIG. 3 is a flow diagram of steps of a method for detecting insulation state provided in another embodiment of the disclosure.

FIG. 3 is a flow diagram of a method for detecting insulation state provided in another embodiment of the disclosure. Referring to FIG. 1 and FIG. 3, in one embodiment of the method for detecting insulation state of the disclosure, the excitation source 112 is a bus capacitor, and, the method further includes a step before the step S1:

S12, charging the bus capacitor 112 till a voltage of the bus capacitor 112 is charged above a preset voltage value.

Figure 4:
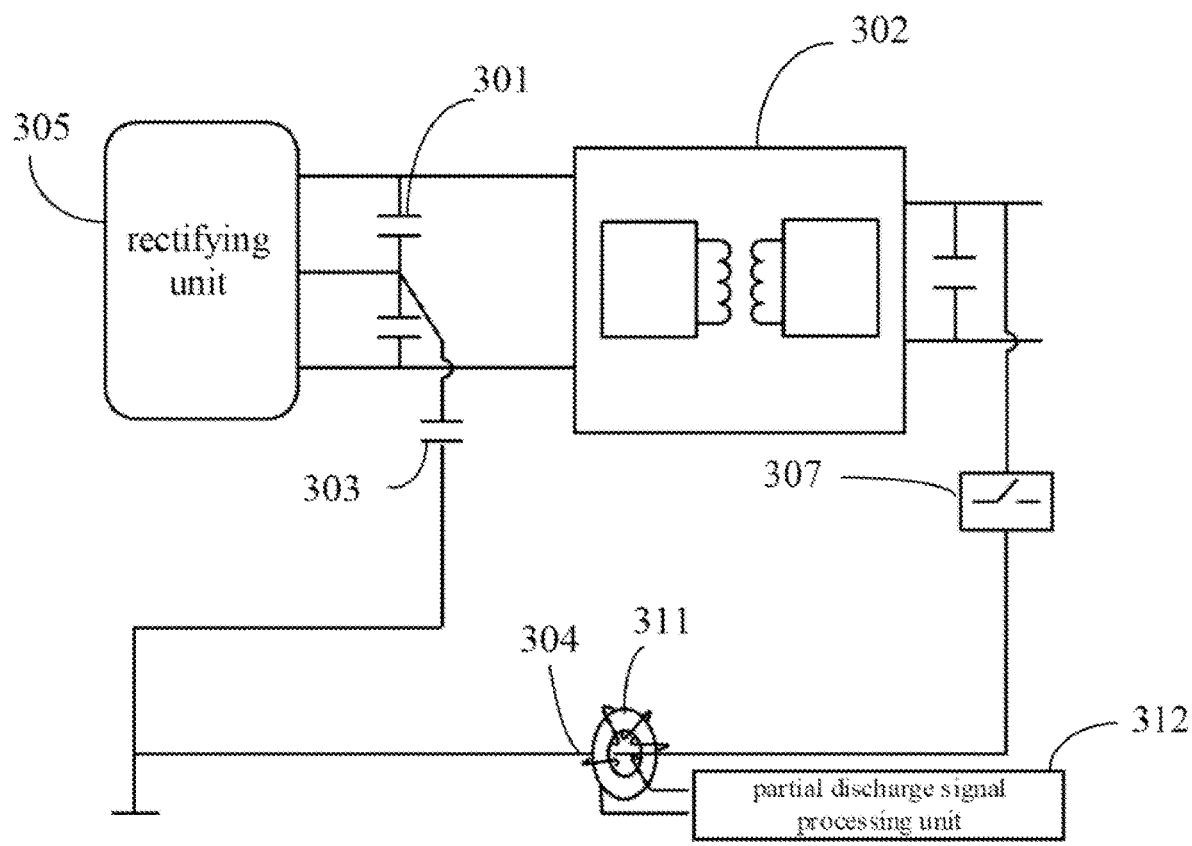
FIG. 4 is a schematic diagram of a device for detecting insulation state in a conversion system provided in one embodiment of the disclosure.

FIG. 4 is a schematic diagram of a device for detecting insulation state in a conversion system provided in one embodiment of the disclosure. Referring to FIG. 4, the embodiment of the disclosure provides a device for detecting insulation state in a conversion system, wherein the conversion system includes an excitation source 301 (e.g., a bus capacitor), a rectifying unit 305 having an output end coupled to the bus capacitor 301, a converter 302 having an input end coupled to the bus capacitor 301, a connection element 304 coupled between an output end of the converter 302 and a reference point, and a coupling impedance 303 having a first end coupled to the bus capacitor 301 and a second end coupled to the reference point. The reference point can be selected as any point in the circuit, for example, earth, but not limit to. In some embodiments, the bus capacitor 301 may include a single capacitor connected in parallel to the output end of the rectifying unit 305. In some embodiments, the bus capacitor 301 may include two capacitors connected in series, and the capacitors after connected in series are connected in parallel to the output end of the rectifying unit 305. A series connection point of the capacitors is connected to a midpoint of the rectifying unit 305, and the first end of the coupling impedance 303 is connected to the midpoint of the rectifying unit 305. It shall be noted that the number and series and parallel connection ways of the capacitors included in the bus capacitor 301 are not limited.

The device for detecting insulation state includes:
- a pulse current sensor 311 sleeved on the connection element 304 for detecting a pulse current signal of the connection element 304; and
- a partial discharge signal processing unit 312 connected to the pulse current sensor 311 for receiving the pulse current signal, processing the pulse current signal, and outputting partial discharge information, which indicating an insulation state of the isolating transformer in the converter 302.

As can be seen, it is unnecessary to supply an excitation source for detection of the insulation state additionally. By using the existing power source in the conversion system as the excitation source 301, such that detection of partial discharge of the isolating transformer in the conversion system becomes simple, reliable, efficient, and low-cost.

Referring to FIG. 4, the rectifying unit 305 is configured to charge the bus capacitor 301, till a voltage of the bus capacitor 301 is charged above a preset voltage value.

In some embodiments, after the voltage of the bus capacitor 301 is charged above the preset voltage value, at least one main power switch of the converter 302 is turned off, such that it is possible to avoid electromagnetic interference on a partial discharge signal caused by high frequency steep waves, and influence on detection of partial discharge of the isolating transformer in the converter 111.

Referring to FIG. 4, the conversion system further includes a controllable switch 307 connected in series to the connection element 304.

The controllable switch 307 is configured to be conductive before the bus capacitor is charged.

In this embodiment, the controllable switch 307 is disposed at an output side of the isolating transformer, such as a low voltage side, thereby facilitating reducing volume and cost of the controllable switch.

Referring to FIG. 4, the coupling impedance 303 is a filter capacitor in the conversion system.

Figure 5:
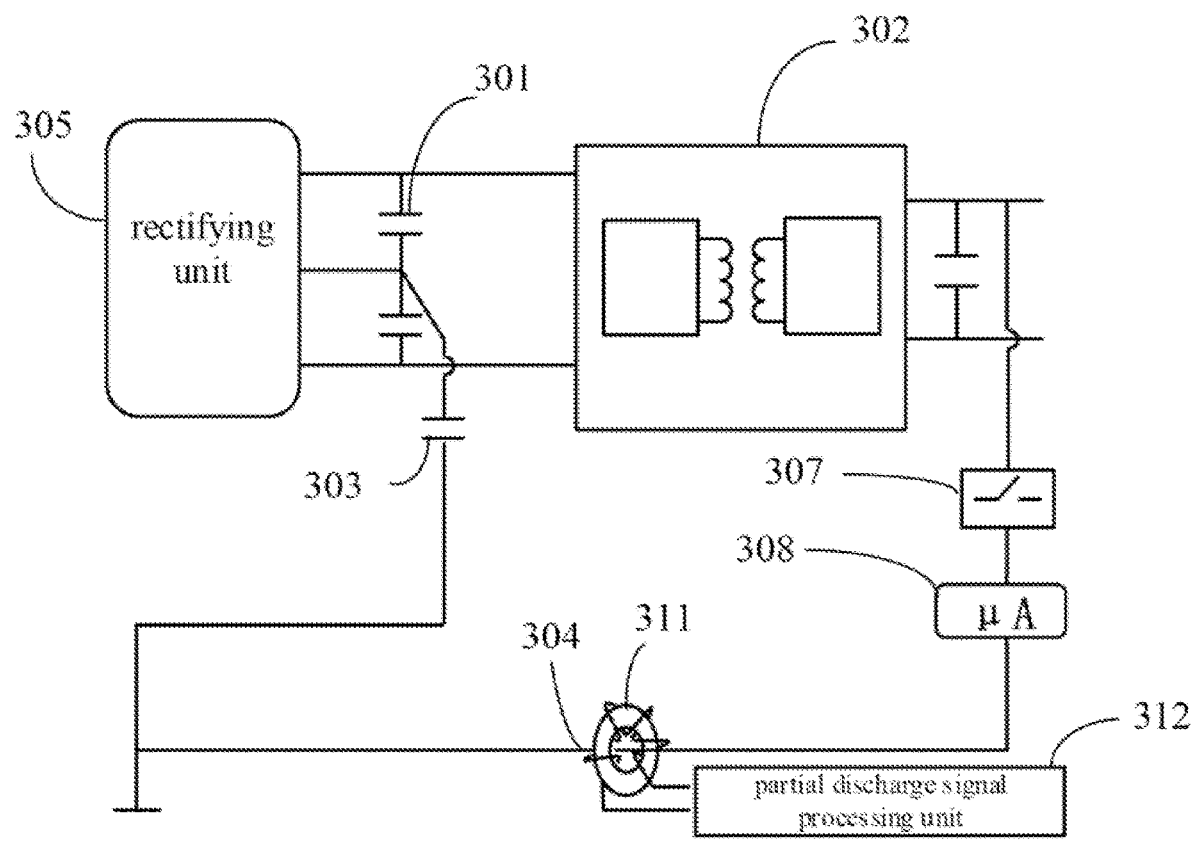
FIG. 5 is a schematic diagram of a device for detecting insulation state provided in another embodiment of the disclosure.

FIG. 5 is a schematic diagram of a device for detecting insulation state provided in another embodiment of the disclosure. Referring to FIG. 4 and FIG. 5, configurations and operations of the device for detecting insulation state in FIG. 5 are similar with that of the device for detecting insulation state in FIG. 4, so for the purpose of simplicity, partial descriptions are not described here.

Referring to FIG. 5, the conversion system further includes a leakage current detection unit 308. The leakage current detection unit 308 is connected in series to the connection element 304 for detecting a leakage current signal of the connection element 304. In some embodiments, the leakage current detection unit 308 is an ampere meter, such as, a micro ammeter.

In some embodiments, the conversion system is configured to shut down when the value of the leakage current signal is greater than a preset value of a preset current signal.

In the above-mentioned embodiments, an aging state of insulation of the isolating transformer of the converter is indicated by using the way of combining detection of partial discharge and detection of a leakage current. Since a bulk resistance is significantly decreased only near an end of aging, the bulk resistance cannot indicate the aging state of the insulation material precisely, the leakage current can reflect a temperature change of the insulation material of the isolating transformer. When the value of the leakage current signal is detected to be greater than the preset value of the preset current signal, the conversion system stops operation, and after the fault is fixed, the conversion system resumes.

In general cases, an electrical resistivity of the insulation material decreases as temperature rises, resulting in reduced service life. By the way of combining detection of partial discharge and detection of a leakage current, the insulation state of the isolating transformer can be more accurate to be detected, the users can be timely reminded to shut down the conversion system and troubleshoot, thereby improving reliability of the conversion system.

In some cases, a serious accumulation of dust or fan failure in the transformer system can also lead to a high temperature rise in the isolating transformer, which in turn can lead to an increase in the leakage current of the isolating transformer. The above problem can be identified by detecting the leakage current, allowing the user to clean the dust and repair or replace the fan in time, improving the reliability of the conversion system.

Referring to FIG. 3 and FIG. 5, in some embodiments, the step S12 includes a step of: controlling the rectifying unit 305 to charge the bus capacitor 301, till the voltage of the bus capacitor 301 is charged above the preset voltage value.

In some embodiments, the controllable switch 307 is controlled to be conductive before the rectifying unit 305 charges the bus capacitor 301. Therefore, referring to FIG. 3, before the step S12, it further includes step S11: controlling the controllable switch to be conductive.

In some embodiments, the leakage current signal is detected by the leakage current detection unit 308, and when the value of the leakage current signal reaches the preset value of the preset current signal, the conversion system is controlled to be shutdown. Therefore, referring to FIG. 3, after the step S3, it further includes step S4: detecting a leakage current signal, and the value of the leakage current signal reaches the preset value of the preset current signal, controlling the conversion system to stop operation.

Figure 6:
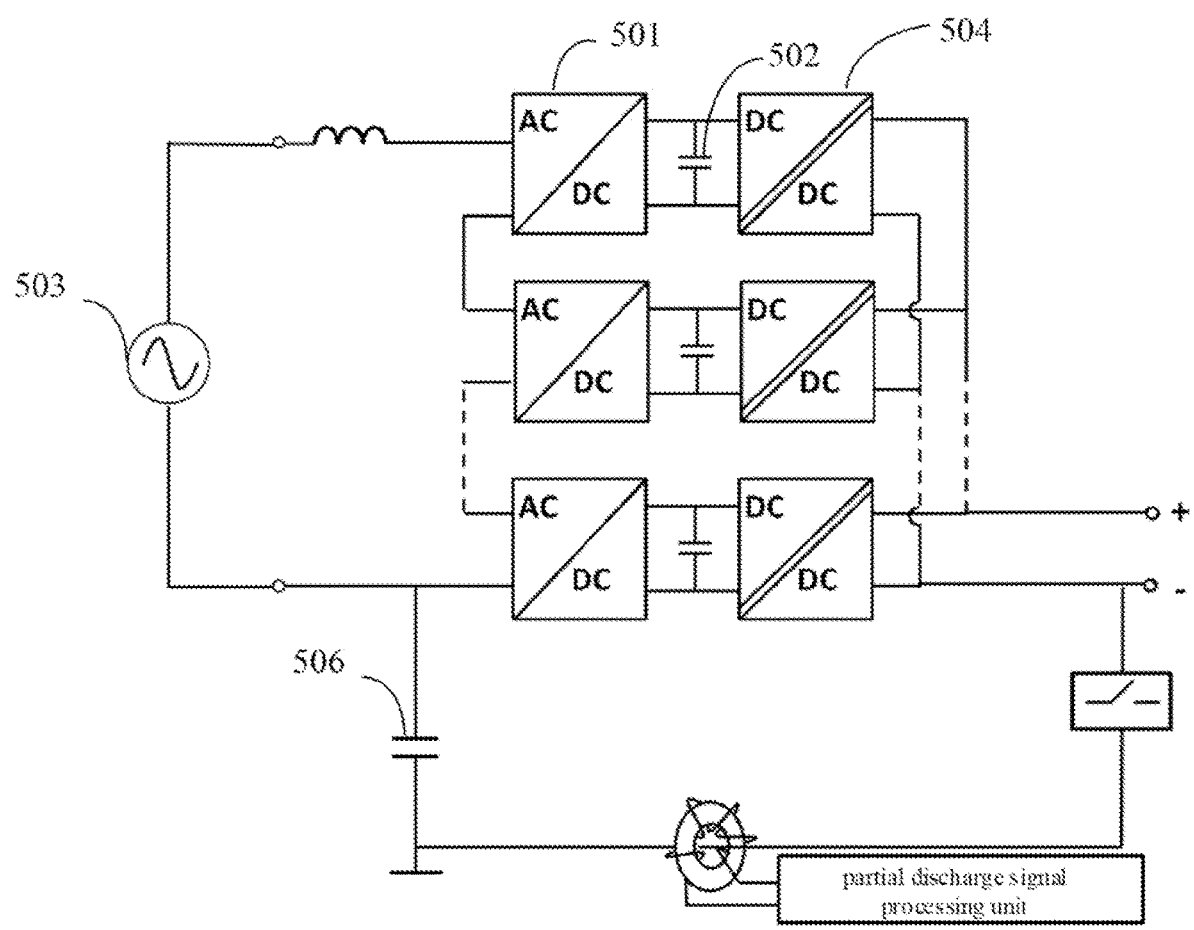
FIG. 6 is a schematic diagram of a device for detecting insulation state provided in still another embodiment of the disclosure.

FIG. 6 is a schematic diagram of a device for detecting insulation state provided in still another embodiment of the disclosure. Referring to FIG. 6, a converter includes a plurality of conversion units, each conversion unit including a rectifying unit 501, a capacitor 502 and a DC-to-DC unit 504. In each conversion unit, the capacitor 502 is connected in parallel between the rectifying unit 501 (AC/DC) and the DC-to-DC unit 504 (DC/DC), and the DC-to-DC unit includes an isolating transformer. Input ends of all rectifying units 501 are connected in series and then in parallel connects to a first input end and a second input end of the converter, and output ends of all DC-to-DC units are connected in parallel to an output end of the converter. One end of an excitation source 503 is coupled to the first input end of the converter, the other end of the excitation source 503 is coupled to the second input end of the converter, and a first end of a coupling impedance 506 is connected to the second input end of the converter.

In some embodiments, the excitation source 503 can be an AC source. The AC source can be an output voltage of a power grid.

Referring to FIG. 4, in some embodiments, the rectifying unit 305 (Active Front End, AFE) rectifies an AC voltage from the power grid into a DC voltage for charging the bus capacitor 301, and functions as an excitation source for detecting partial discharge information of the isolating transformer. A partial discharge detection loop with low impedance is constructed by the excitation source 301, the converter 302, the controllable switch 307, the filter capacitor and the connection element. Firstly, the bus capacitor 301 is pre-charged by the rectifying unit 305, and after pre-charging is completed, at least one main power switch of the converter is controlled not to switch through a preset control method, such that electromagnetic interference of high frequency steep waves on a partial discharge signal can be avoided. The controllable switch 307 is selected to be disposed at a low voltage side of the isolating transformer, where is with a small voltage difference, thereby facilitating reducing volume and cost of the controllable switch.

Secondly, the detected pulse current signal is processed, and the partial discharge information of the isolating transformer is fed back to the users via a partial discharge signal processing circuit.

FIG. 5 shows an aging state of insulation of the transformer in the detected system indicated by using the way of combining partial discharge and a leakage current, and the leakage current detection unit 308 is added in FIG. 5, which is in particularly a microammeter. Since a bulk resistance only decreases significantly near the end of aging, the bulk resistance is an inappropriate characterization of the aging state of the insulation material. Here the leakage current is mainly used to reflect changes in the temperature of the transformer insulation material. When a large leakage current is detected, the system is shut down and operate again after troubleshooting.

Generally, an electrical resistivity of the insulation material decreases as temperature rises, and service life is reduced. A microammeter is connected in series in the partial discharge detection loop, while monitoring the leakage current. If the leakage current is too large, the users can be alerted to stop the system for troubleshooting, thereby further improving reliability of the system.

In case of a serious accumulation of dust in the system, or a fan failure that may lead to a high temperature rise in the transformer, which in turn leads to an increase in the transformer leakage current.

FIG. 6 shows one embodiment of the disclosure applied in another circuit topology, and a difference is that the excitation source is supplied by an AC voltage from the power grid.

Therefore, the disclosure further has the following advantages:

1) the embodiments of the disclosure avoid electromagnetic interference of high frequency steep waves to the partial discharge signal by controlling at least one main power switches from operating;

2) the embodiments of the disclosure do not need to supply an additional excitation source for the insulation state detection by using the existing power source in the conversion system as the excitation source 112, making the detection of partial discharge of the isolating transformer in the conversion system simpler, more reliable, more efficient, and less costly.

Of course, the disclosure may further have various other embodiments, and those having ordinary skill in the art shall make various corresponding modifications and variations to the disclosure without departing from spirit and essence of the disclosure, but these corresponding modifications and variations shall belong to the scope protected by the appended claims of the disclosure.

What is claimed is:

1. A method for detecting insulation state in a conversion system, wherein the conversion system includes an excitation source, a converter having an input end coupled to the excitation source, a connection element coupled between an output end of the converter and a reference point, and a coupling impedance having a first end coupled to the excitation source and a second end coupled to the reference point, the method for detecting insulation state including steps of:
    S1, controlling at least one main power switch of the converter not to switch;
    S2, detecting a pulse current signal of the connection element; and
    S3, processing the pulse current signal and outputting a partial discharge information, wherein the partial discharge information indicating an insulation state of an isolating transformer in the converter.

2. The method for detecting insulation state in a conversion system according to claim 1, wherein the excitation source is a bus capacitor, before the step S1, further including a step of:
    S12, charging the bus capacitor till a voltage of the bus capacitor is charged above a preset voltage value.

3. The method for detecting insulation state in a conversion system according to claim 2, wherein the conversion system further includes a rectifying unit having an output end connected to the bus capacitor, and the step S12 further includes:
    controlling the rectifying unit to charge the bus capacitor till the voltage of the bus capacitor is charged above the preset voltage value.

4. The method for detecting insulation state in a conversion system according to claim 3, wherein the conversion system further includes a controllable switch connected in series to the connection element, before the step S12, further including step S11:
    S11, controlling the controllable switch to be conductive.

5. The method for detecting insulation state in a conversion system according to claim 1, further including step S4:
    detecting a leakage current signal, and when a value of the leakage current signal reaches a preset value of a preset current signal, controlling the conversion system to stop operation.

6. The method for detecting insulation state in a conversion system according to claim 1, wherein the excitation source is an AC source.

7. A device for detecting insulation state in a conversion system, wherein the conversion system includes an excitation source, a converter having an input end coupled to the excitation source, a connection element coupled between an output end of the converter and a reference point, and a coupling impedance having a first end coupled to the excitation source and a second end coupled to the reference point,
    the device for detecting insulation state including:
    a pulse current sensor sleeved on the connection element for detecting a pulse current signal of the connection element when at least one main power switch of the converter does not switch; and
    a partial discharge signal processing unit connected to the pulse current sensor for receiving the pulse current signal, processing the pulse current signal, and outputting a partial discharge information, wherein the partial discharge information indicates an insulation state of an isolating transformer in the converter.

8. The device for detecting insulation state in a conversion system according to claim 7, wherein the excitation source is a bus capacitor, and a voltage of the bus capacitor is above a preset voltage value.

9. The device for detecting insulation state in a conversion system according to claim 8, wherein the conversion system further includes a rectifying unit having an output end connected to the bus capacitor, wherein the rectifying unit is configured to charge the bus capacitor till the voltage of the bus capacitor is charged above the preset voltage value.

10. The device for detecting insulation state in a conversion system according to claim 9, wherein the conversion system further includes a controllable switch connected in series to the connection element.

11. The device for detecting insulation state in a conversion system according to claim 10, wherein the controllable switch is configured to be conductive before the bus capacitor is charged.

12. The device for detecting insulation state in a conversion system according to claim 7, wherein the conversion system further includes a leakage current detection unit;
the leakage current detection unit is connected in series to the connection element for detecting a leakage current signal of the connection element.

13. The device for detecting insulation state in a conversion system according to claim 12, wherein the conversion system is configured to stop operation when a value of the leakage current signal reaches a preset value of a preset current signal.

14. The device for detecting insulation state in a conversion system according to claim 12, wherein the leakage current detection unit is an ampere meter.

15. The device for detecting insulation state in a conversion system according to claim 7, wherein the excitation source is an AC source.

16. The device for detecting insulation state in a conversion system according to claim 7, wherein the converter includes a plurality of conversion units, each conversion unit including a rectifying unit, a capacitor and a DC-to-DC unit, the capacitor is connected in parallel between the rectifying unit and the DC-to-DC unit, input ends of all rectifying units are connected in series and then in parallel connects to a first input end and a second input end of the converter, and output ends of all DC-to-DC units are connected in parallel to the output end of the converter.

17. The device for detecting insulation state in a conversion system according to claim 7, wherein the coupling impedance is a filter capacitor in the conversion system.

* * * * *